United States Patent
Malekzadeh et al.

(10) Patent No.: US 10,009,033 B2
(45) Date of Patent: Jun. 26, 2018

(54) NOISE REDUCTION IN NON-LINEAR SIGNAL PROCESSING

(71) Applicant: Microsemi Semiconductor ULC, Kanata (CA)

(72) Inventors: Foad Arfaei Malekzadeh, Ottawa (CA); Mehran Aliahmad, Manotick (CA)

(73) Assignee: Microsemi Semiconductor ULC, Kanata, ON (CA)

(*) Notice: Subject to any disclaimer, the term of this patent is extended or adjusted under 35 U.S.C. 154(b) by 0 days. days.

(21) Appl. No.: 15/278,187

(22) Filed: Sep. 28, 2016

(65) Prior Publication Data

US 2017/0093410 A1    Mar. 30, 2017

Related U.S. Application Data

(60) Provisional application No. 62/234,073, filed on Sep. 29, 2015.

(51) Int. Cl.
| | |
|---|---|
| *H03M 1/20* | (2006.01) |
| *H03M 3/00* | (2006.01) |
| *H03M 1/36* | (2006.01) |
| *H03M 1/10* | (2006.01) |
| *H03L 7/099* | (2006.01) |
| *G06F 1/02* | (2006.01) |

(52) U.S. Cl.
CPC ........... *H03L 7/0991* (2013.01); *G06F 1/022* (2013.01); *H03M 3/328* (2013.01); *H03M 3/424* (2013.01); *H03M 3/50* (2013.01)

(58) Field of Classification Search
CPC ........ H03M 3/424; H03M 3/328; H03M 3/50; H03L 7/0991; G06F 1/022
See application file for complete search history.

(56) References Cited

U.S. PATENT DOCUMENTS

| | | | | |
|---|---|---|---|---|
| 4,864,305 A | * | 9/1989 | Toyama | H03M 1/0639 |
| | | | | 341/122 |
| 4,968,987 A | * | 11/1990 | Naka | H03M 3/328 |
| | | | | 341/143 |
| 5,073,778 A | | 12/1991 | Ueki et al. | |
| 5,148,163 A | * | 9/1992 | Frindle | H03M 1/0641 |
| | | | | 341/131 |
| 6,823,033 B2 | | 11/2004 | Fahim | |
| 8,730,076 B2 | * | 5/2014 | Zare-Hoseini | H03M 7/3008 |
| | | | | 341/131 |
| 2008/0048726 A1 | | 2/2008 | Hafed | |
| 2012/0244824 A1 | | 9/2012 | Entezari et al. | |

OTHER PUBLICATIONS

International Search Report and Written Opinion dated Dec. 22, 2016 (PCT/CA2016/051086).

* cited by examiner

*Primary Examiner* — Kenneth B Wells

(74) *Attorney, Agent, or Firm* — Simon Kahn

(57) ABSTRACT

A method for reducing the jitter introduced into a digital signal by a non-linear processing element involves applying an input word representing the digital signal to a first signal path comprising a first non-linear processing element, and a complementary version of the input word to a second signal path comprising a second non-linear processing element. A common mode dither signal is injected into each signal path upstream of the non-linear processing elements. The outputs of the non-linear processing elements are combined to produce a common output with the common mode dither signal removed.

21 Claims, 7 Drawing Sheets

NOISE REDUCTION IN NON-LINEAR SIGNAL PROCESSING

CROSS REFERENCE TO RELATED APPLICATION

This application claims the benefit under 35 USC 119 (e) of prior U.S. provisional application No. 62/234,073, filed Sep. 29, 2015.

FIELD OF THE INVENTION

This invention relates to the field of digital signal processing, and in particular to a novel dithering technique to reduce quantization noise due to nonlinearities in a digital signal processing system. The invention is generally applicable to digital systems wherein jitter is introduced into a digital signal by a non-linear processing element, and is specifically applicable to the jitter introduced by truncators in numerically controlled oscillators and delta-sigma converters.

BACKGROUND OF THE INVENTION

Digital frequency synthesis techniques are widely used in different systems to generate accurate clock frequencies with great flexibility. At the heart of such systems, there is usually one (or more) Digitally Controlled Oscillator (DCO) or Numerically Controlled Oscillators (NCO). As shown in FIG. 1, these basically consist of a digital accumulator that generates the instantaneous phase ($\Phi$) for a desired output frequency set by a frequency select word (FSW) input. The accumulator is clocked by a system clock. On each system clock cycle, the accumulator adds the previously accumulated value to the current frequency select word FSW to generate an output phase word $\phi$.

The accumulator content is often used in downstream blocks to represent the phase of the signal. For example, in direct digital frequency synthesis systems (DDFS) the instantaneous phase ($\Phi$) output by the accumulator drives a digital-to-analog converter (DAC) to generate a well-shaped output signal or it can be used in a phase shifter to move the phase of another clock.

The accuracy of an NCO, or DCO, depends on the register width in the accumulator (N); the larger the number of bits in the accumulator, the higher the accuracy of the synthesized frequency. For example register widths between 24 to 48 bits are commonly used to generate very accurate frequencies.

Since processing a large number of bits in the downstream blocks is not practical only a few most significant bits are kept (M) and the rest are dropped. This function is performed by the quantizer shown in FIG. 1, which in this case truncates the phase word at the accumulator output by dropping the N-M least significant bits.

Truncation is a nonlinear mechanism that generates spurious components in the frequency spectrum of the analog signal. The generated spurious components increase the jitter (defined based on the difference between the truncated phase and output phase of the NCO/DCO ($\phi_1 - \phi$). The generated spur is in effect the quantization noise due to truncation and is shown in FIG. 2.

Truncation of the phase word thus adds noise to the original accumulator output. It is therefore highly desirable to reduce spur power without increasing the number of bits after truncation.

A number of different techniques exist for reducing the truncation noise. They are generally based on randomization and/or noise shaping concepts. Randomization is usually performed by injecting a dither signal to disturb the periodicity and spread the spurs in the frequency domain. The dither signal is added to the phase values before truncation. Both random sequences and deterministic signals have been used for dithering. Such techniques spread the power of the spurs over a wider band at the cost of adding more noise and raising the noise floor. Post filtering can alleviate this problem but often it is not practical and/or efficient.

A different approach is based on noise shaping, often with a delta-sigma modulator, in which spur power is pushed out of the frequency band of interest. For such methods to be effective, a large oversampling ratio is usually required which is not always possible due to speed limitation of real circuits.

SUMMARY OF THE INVENTION

Embodiments of the invention provide a method and apparatus for noise reduction in NCO, DCO and frequency synthesizers due to nonlinearities such as truncation and quantization. In general terms the signal is passed through two (or more) complementary paths where it is added to a common-mode dither signal that is removed after passing through the non-linear functions by simple summation or subtraction.

Embodiments of the invention employ a novel method of dithering to reduce the in-band spur power and remove additional noise without any special filtering. Such embodiments can offer an efficient way of reducing jitter without extra noise penalty. The invention is applicable to both software and hardware implementations.

According to the present invention there is provided an apparatus for reducing the jitter introduced into a representation of a digital signal by a non-linear processing element, comprising a first signal path receiving an input word representing said digital signal and comprising a first non-linear processing element; a second signal path receiving a complementary version of said input word and comprising a second non-linear processing element; a dither signal generator for injecting a common mode dither signal into each signal path upstream of said non-linear processing elements; and a combiner for combining outputs of said first and second non-linear processing elements to produce a common output with said common mode dither signal removed.

It will be appreciated that the dither signal manifests itself in the form of a digital word.

The non-linear processing elements should normally be identical and may, for example, be truncators, digital-to-analog converters (DACs) or sigma-delta modulators (SDMs) without limitation.

According to another aspect of the invention there is provided a digital synthesizer, comprising: a digital or numerically controlled oscillator responsive to a frequency select word having a number of bits N to generate a phase output word of N bits at a frequency determined by said frequency select word; an inverter for producing a complementary version of said phase output word; a first signal path receiving said phase output word and comprising a first truncator for truncating said phase output word to produce a phase word having fewer bits than said phase output word; a second signal path receiving the complementary version of said phase output word and comprising a second truncator for truncating the complementary version of said phase output word to produce a phase word having fewer bits than said phase output word; a dither signal generator for injecting a common mode dither signal into each signal path upstream of said first and second truncators; and a combiner for combining outputs of said first and second truncators to produce a common output phase word with said common mode dither signal removed.

According to yet another aspect of the invention there is provided a method for reducing the jitter introduced into a software representation of a digital signal by a non-linear processing element, comprising: applying an input word representing said digital signal to a first signal path comprising a first non-linear processing element; applying a complementary version of said input word to a second signal path comprising a second non-linear processing element; injecting a common mode dither signal into each signal path upstream of said non-linear processing elements; and combining outputs of said first and second non-linear processing elements to produce a common output with said common mode dither signal removed.

BRIEF DESCRIPTION OF THE DRAWINGS

This invention will now be described in more detail, by way of example only, with reference to the accompanying drawings, in which.

DETAILED DESCRIPTION OF PREFERRED EMBODIMENTS

Figure 1:
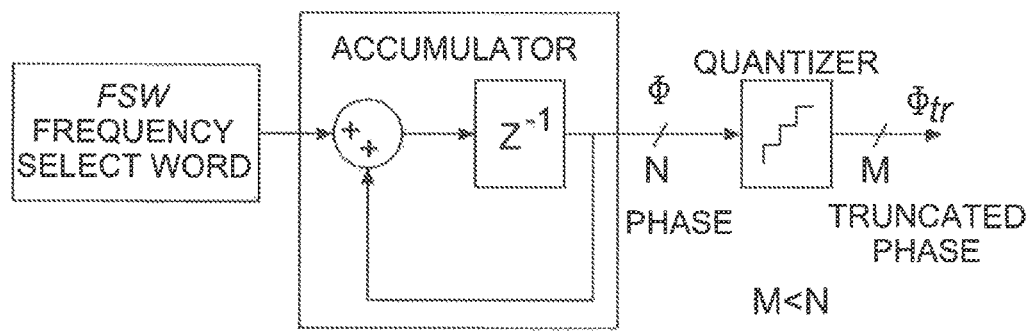
FIG. 1 is a block diagram of a prior art digitally controlled oscillator and quantizer.
Figure 2:
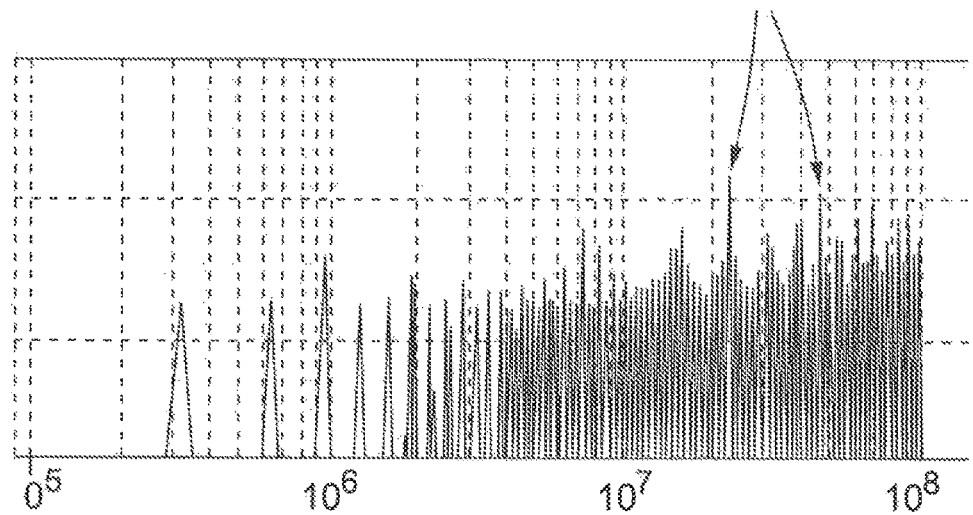
FIG. 2 is a frequency chart showing spurs produced by a truncation operation of the prior art.
Figure 3:
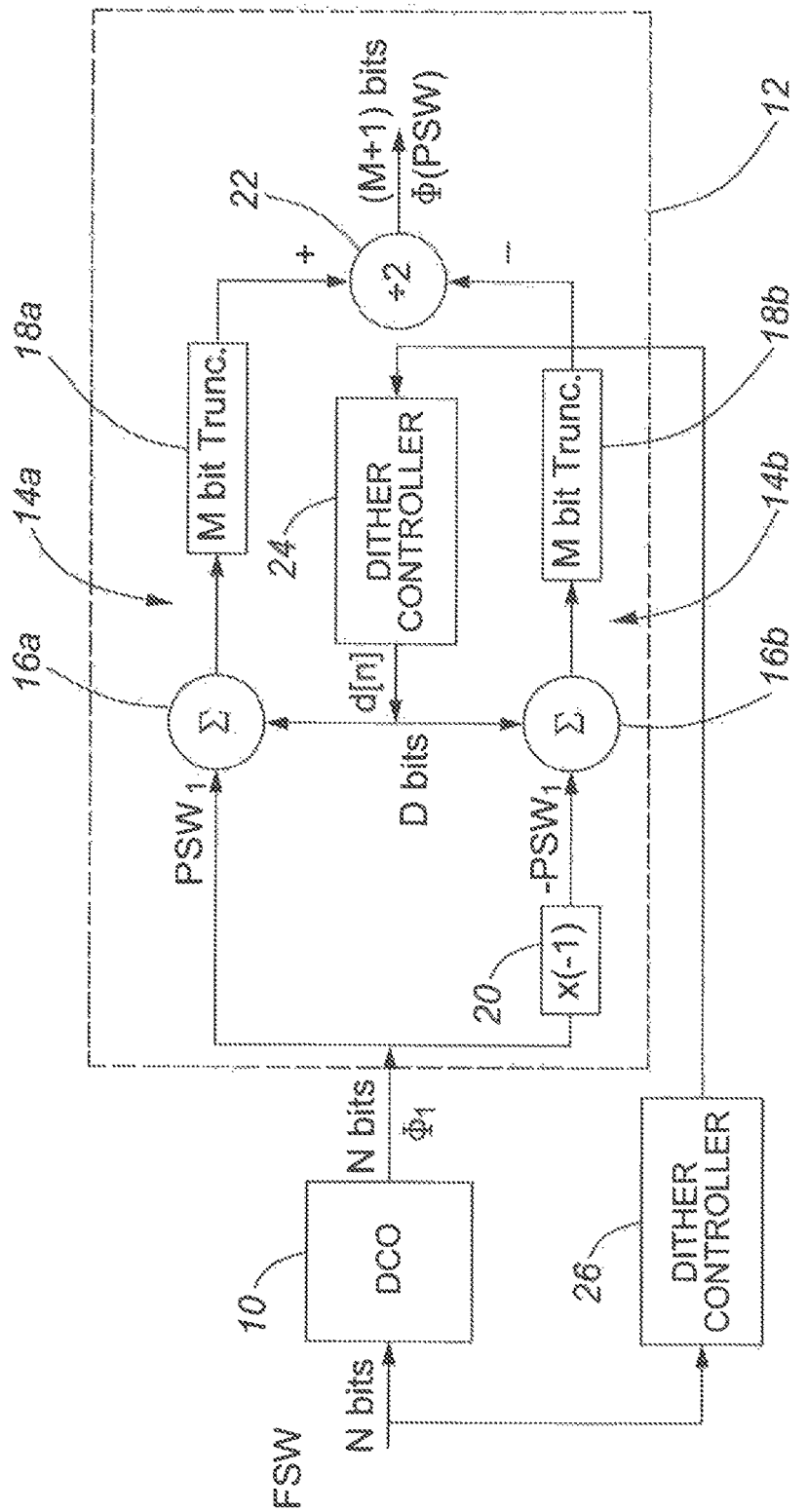
FIG. 3 is a block diagram of a digitally controlled oscillator with a dither circuit in accordance with an embodiment of the invention.

One non-limiting exemplary application of the invention in the context of digital synthesizers is shown in FIG. 3, where a DCO, or NCO, 10 receives at its input an N-bit frequency select word (FSW) that determines the frequency of the DCO/NCO 10. The DCO/NCO 10 outputs an N-bit phase word $\phi_1$, which is fed to the input of quantizer 12. The frequency select word FSW is also fed to a dither controller 26. The function of the dither controller 26 is to set the appropriate amount of dither based on the criteria explained below with reference to FIGS. 4 and 6. The dither controller 26 may also determine that no dither is required, in which case it sets its digital output signal to zero. In this case the system functions as a conventional system as described above with a single path phase signal undergoing an N bit to M+1 bit truncation.

The frequency select word FSW input to the DCO 10 determines the intended frequency for which the time domain phase is tracked by the output. In this non-limiting example, the DCO/NCO 10 is merely an accumulator for which the output signal at any time is the summation of the input signal at prior moments. If the input frequency is a constant signal, the output is the time domain phase of a sinusoidal signal with that constant input frequency.

The number of bits (N) in the output phase word is usually a large number, for example, 48 or 96 bits to provide a good frequency/phase resolution.

When the N-bit phase word is to be applied to a DAC (Digital to Analog Convertor), the practical limit of the number of DAC bits comes into play. Usually the output signal has to be truncated to a much lower number of bits, typically 8 to 12 bits, for a feasible digital to analog conversion. The number of bits in the phase word $\phi_1$ is reduced in the quantizer 12 to produce an output phase word $\phi$.

In this non-limiting example, the quantizer 12 has two complementary paths 14a, 14b, each receiving the phase word $\phi_1$ output by the DCO 10. It will be appreciated that more than two complementary paths can be employed if desired.

Each path 14a, 14b comprises respectively an adder 16a, 16b and an M-bit truncator 18a, 18b. The role of the truncators 18a, 18b is to remove the least significant bits leaving only the M most significant bits.

An inverter 20 is provided upstream of the path 14b to provide the complement of the phase word $\phi_1$. As a result phase word $\phi_1$ (PSW$_1$) output by the DCO/NCO 10 is applied to a first input of adder 16a in path 14a, and its complementary counterpart—$\overline{PSW_1}$ is applied to a first input of the adder 16b in the second path 14b. The outputs of the adders 16a, 16b are truncated to M bits in the truncators 18a, 18b.

The output of the truncator 18b is subtracted from the output of truncator 18a and the result divided by two in combiner 22 provided by a subtractor and divider by 2. The output of combiner 22 is an M+1 bit phase word $\phi$ (PSW).

The second input to adders 16a, 16b is a dither word synthesized in dither synthesis block 24.

Figure 4:
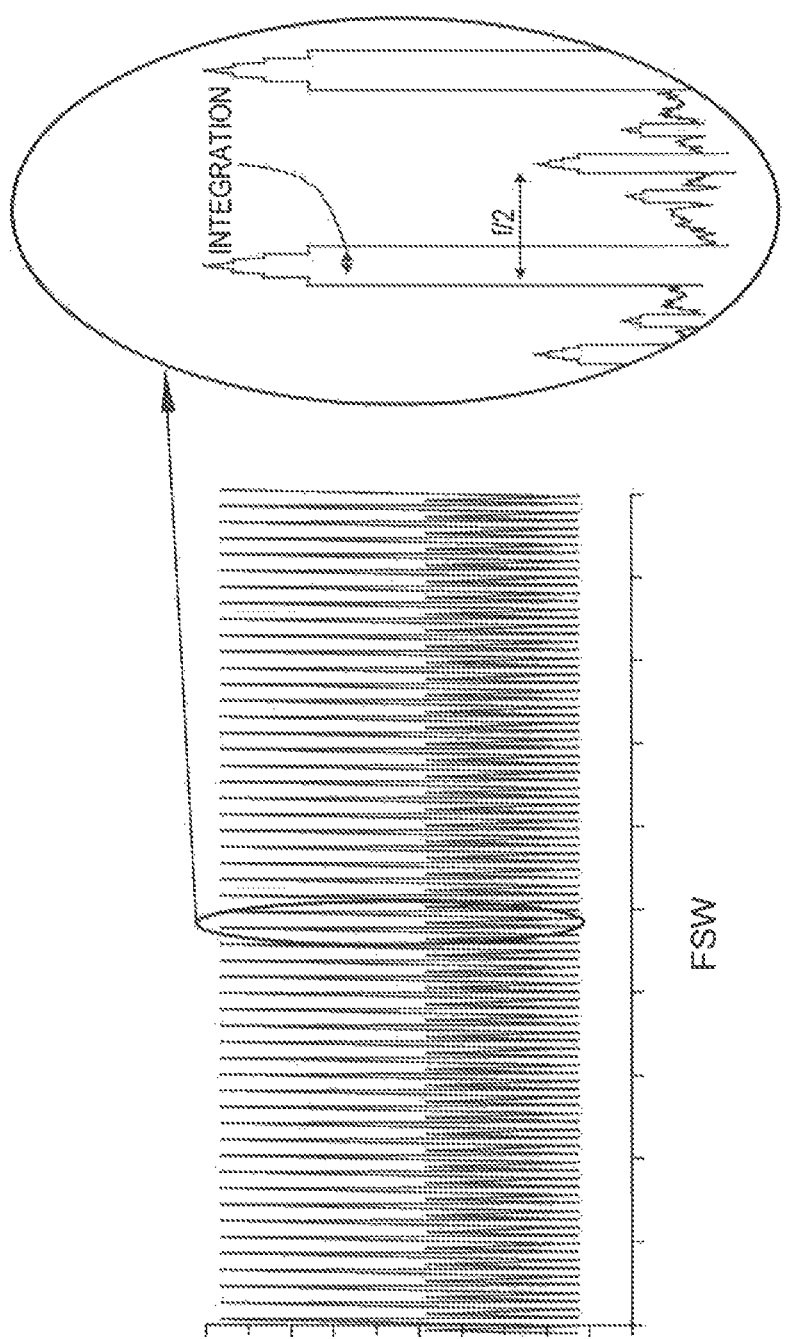
FIG. 4 shows a jitter profile vs. frequency for a non-linear system in accordance with embodiments of the invention.

In accordance with embodiments of the invention dithering may be applied selectively depending on the frequency of the DCO/NCO 10 under the control of the dither controller 26. As shown in FIG. 4 the band limited jitter profile vs. FSW consists of peaks and valleys that are independent of N but depend on frequency, the truncated number of bits (M) and the jitter integration bandwidth. Dithering is only applied by the dither controller 26 for high jitter frequencies and is turned on and off based on the FSW setting.

Looking at FIG. 4, it will be observed that the jitter peaks repeat at multiples of full_scale (namely the maximum frequency that can be generated by the DCO 10) divided by $2^M$. To summarize the following attributes apply to the repetitive profile illustrated in FIG. 4:

1. The number of peaks is $2^M$, where M is the number of output truncated bits on each path.
2. The peaks repeat at multiples of full-scale/$2^M$
3. The jitter integration band sets the width of the peaks.
4. The clock frequency sets the distance between the peaks The jitter integration band sets the width of those peaks so that the peak to peak distance is the clock frequency (Fclk) of the accumulator, the middle point of two peaks as shown magnified in the insert FIG. 4 is the Nyquist frequency of the accumulator clock (Fclk/2), and the distance between two consecutive peaks is equal to the clock frequency Fclk.

If the frequency lies within the peaks, it can be alternatively moved back and forth into and out of low jitter regions by changing the FSW or adding a triangular dither signal to the phase at the output of DCO 10 before truncation. One side effect of the added dither, however, is its contribution to the background noise. In accordance with embodiments of the invention, the use of two or more similar differential paths allows the dither to be applied differentially. As a result it can be easily removed after truncation so that it has minimal effect on background noise without the need for extra filtering.

The dither signal can be implemented in the phase or frequency domain. If implemented in the phase domain, as shown in FIG. 3, the signal should preferably be a triangular wave in time domain and its slope should be greater than the width of the high-jitter frequency regions in FIG. 4. If it is implemented in frequency domain, as shown in FIG. 5, the dither signal should preferably be a pulse (square wave) with peak-to-peak amplitude greater than the width of the peaks in jitter profile.

Figure 5:
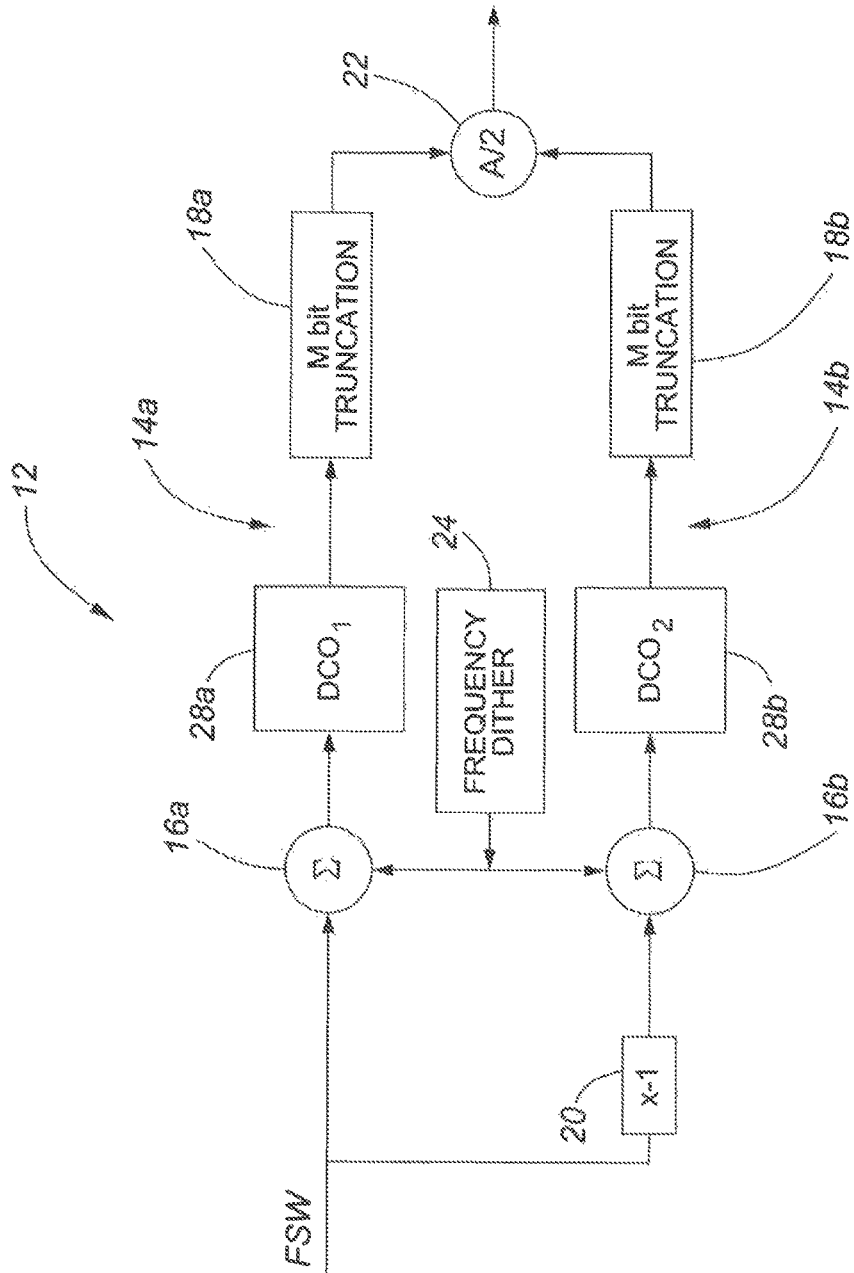
FIG. 5 is a block diagram of an apparatus for implementing dithering in the frequency domain.

One implementation of a quantizer 12 in the frequency domain is shown in FIG. 5. In this embodiment the complementary paths 14a, 14b each include respective DCOs 28a, 28b upstream of the respective truncators 18a, 18b. Instead of the output of a common DCO being applied to the two signal paths 14a, 14b, the frequency select word FSW and its complement, generated by a complement block 20, are applied to the respective signal paths which incorporate the separate DCOs 28a, 28b. The dither signal generator 24 generates a dither frequency, which is added at the input of the identical DCOs 28a, 28b, namely in the frequency domain. In this case the dither signal is a square waveform, which has the same effect as the triangular dither waveform described above in relation to FIG. 3. The outputs of the respective DCOs 281, 28b are each truncated by the respective truncators 18a, 18b and their outputs are combined in combiner 22 provided by a subtractor and divider by 2. The principle of operation in FIG. 5 is otherwise similar to FIG. 3 except that the dither is added in the frequency domain at the input of the DCOs 28a, 28b.

Figure 6A:
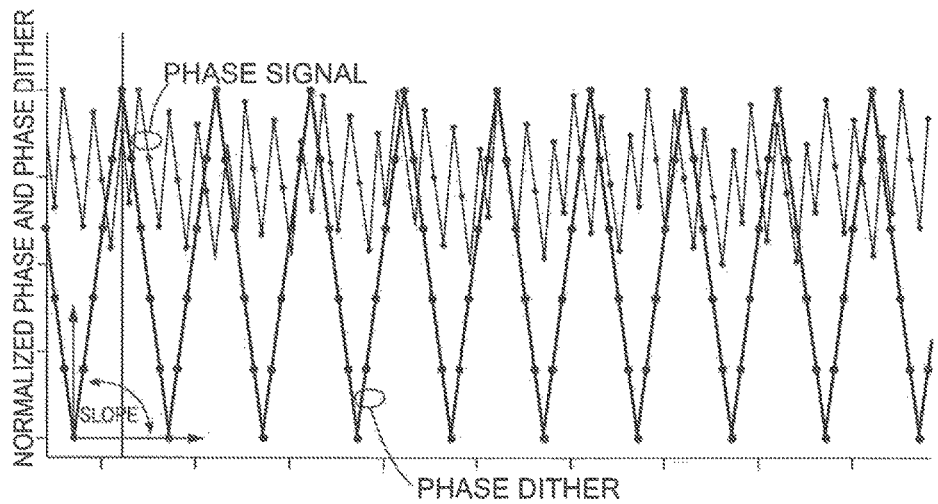
FIGS. 6A and B show the dither signals in the phase and frequency domain respectively.
Figure 6B:
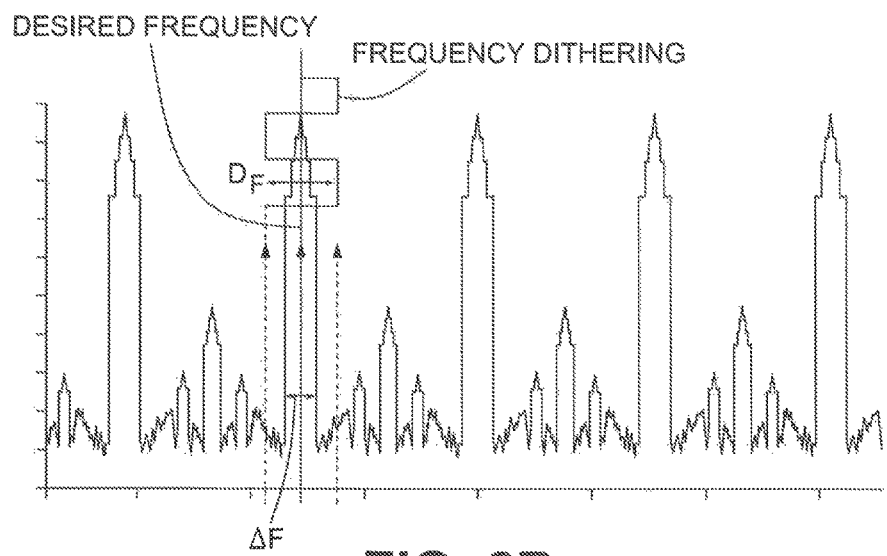

FIGS. 6A and 6B depict the dither waveform in phase and frequency domains vs. time respectively. FIG. 6B is a zoomed version of FIG. 4. The dither signal generated by the dither controller 26, which is a saw tooth in the phase domain (FIG. 6A), is a square wave in the frequency domain (FIG. 6B). The necessary mathematical conditions that should be held in phase and frequency domain are the following:

$$D_F > \Delta F$$

and $D\phi = D_F \times D_{clk}$ or alternatively the necessary condition for the slope is equivalently $$D_\phi > \Delta F / F_{clk}$$

where $D_F$ is the amplitude in the frequency domain of the dither signal generated by the dither controller 26 expressed in terms of frequency deviation as shown in FIG. 6B, $D_\phi$ is the slope of the triangular dither signal shown in FIG. 6A as shown in the phase domain. The Desired Frequency is the desired output frequency of the system.

Figure 8:
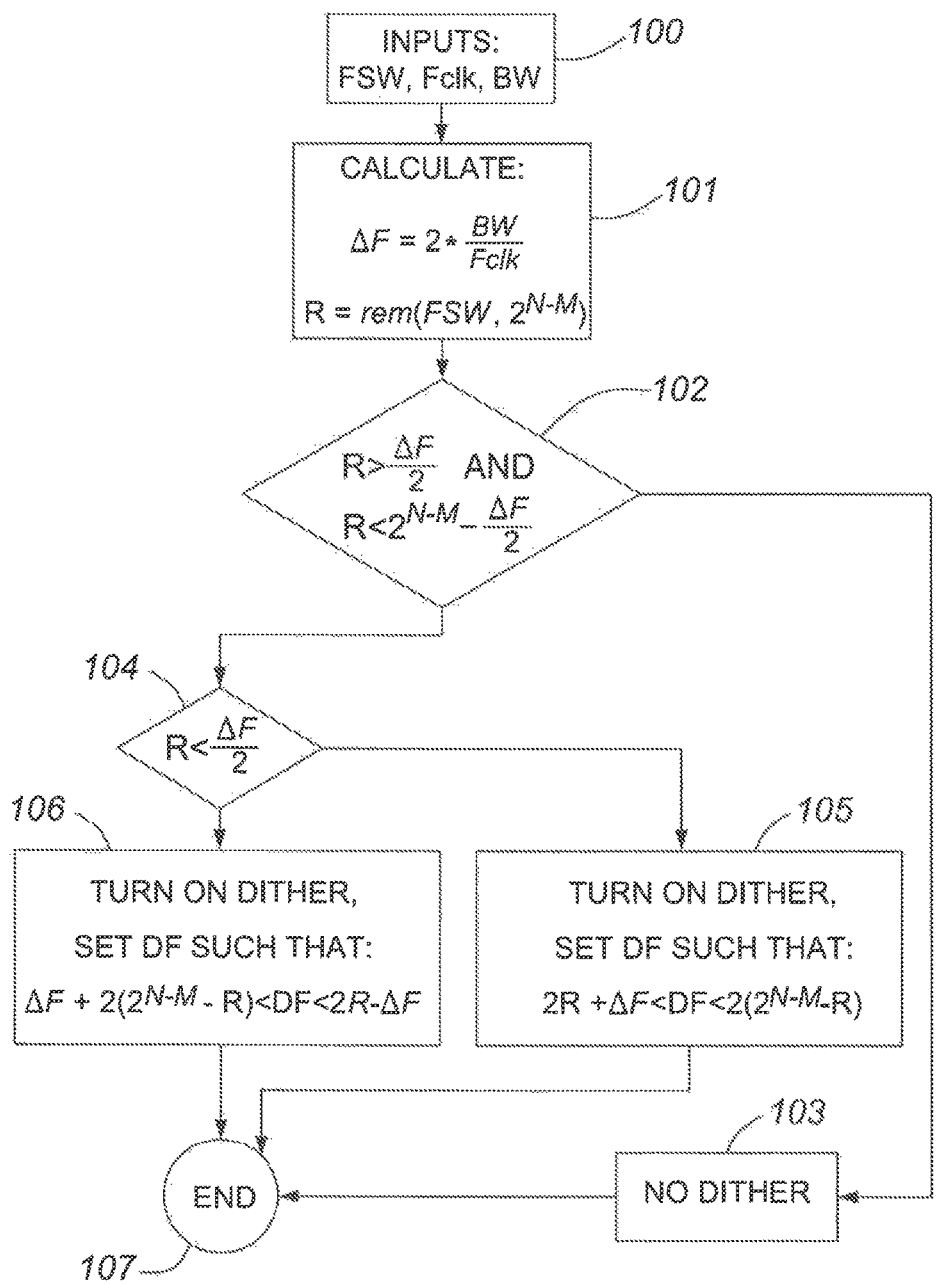
FIG. 8 is a flow chart explaining the operation of the dither controller.

The operation of the dither controller 26 will be explained with reference to the flow chart shown in FIG. 8. It will be appreciated that the dither controller can be implemented either in hardware or software. In this non-limiting exemplary embodiment it is implemented in software running on the controller 26 implemented as a processor.

At step 100, the dither controller accepts inputs FSW, Fclk, and BW, where FSW is the frequency select word, Fclk is the clock frequency, and BW is the bandwidth of the quantizer 12. At step 101 the dither controller computes the values of $\Delta F$ and the remainder R, where $$\Delta F = 2 \times \frac{BW}{Fclk} \text{ and}$$

$$R = \text{rem}(FSW, 2^{N-M})$$

At step 102 the dither controller 26 determines whether the conditions $$R > \frac{\Delta F}{2} \text{ and } R < 2^{N-M} - \frac{\Delta F}{2}$$

apply, and if yes, no dither is applied (step 103). If no, a further determination is made as to whether $$R < \frac{\Delta F}{2}$$

at step 104. If yes, the dither frequency DF is set to satisfy the condition $$2R + \Delta F < DF < 2(2^{N-M} - R)$$

at step 105 and if no, the dither DF is set to satisfy the condition $$\Delta F + 2(2^{N-M} - R) < DF < 2R - \Delta F$$

at step 106.

The algorithm terminates at step 107.

Truncation in each signal path as shown in FIG. 5 is a nonlinearity that generates the main frequency component along with intermodulation components of dither and the main signal. Because the main signal is complementary and the dither signal is a common mode signal the even order intermodulation components are removed along with the common-mode dither in the output summer. Therefore, not only is the extra dither signal eliminated, but also the non-linear components are partly removed, thereby linearizing the whole path.

This technique can be expanded to include other nonlinearities in the path. For example, by moving the DACs before the final summer, their nonlinearity can also be reduced.

Figure 7:
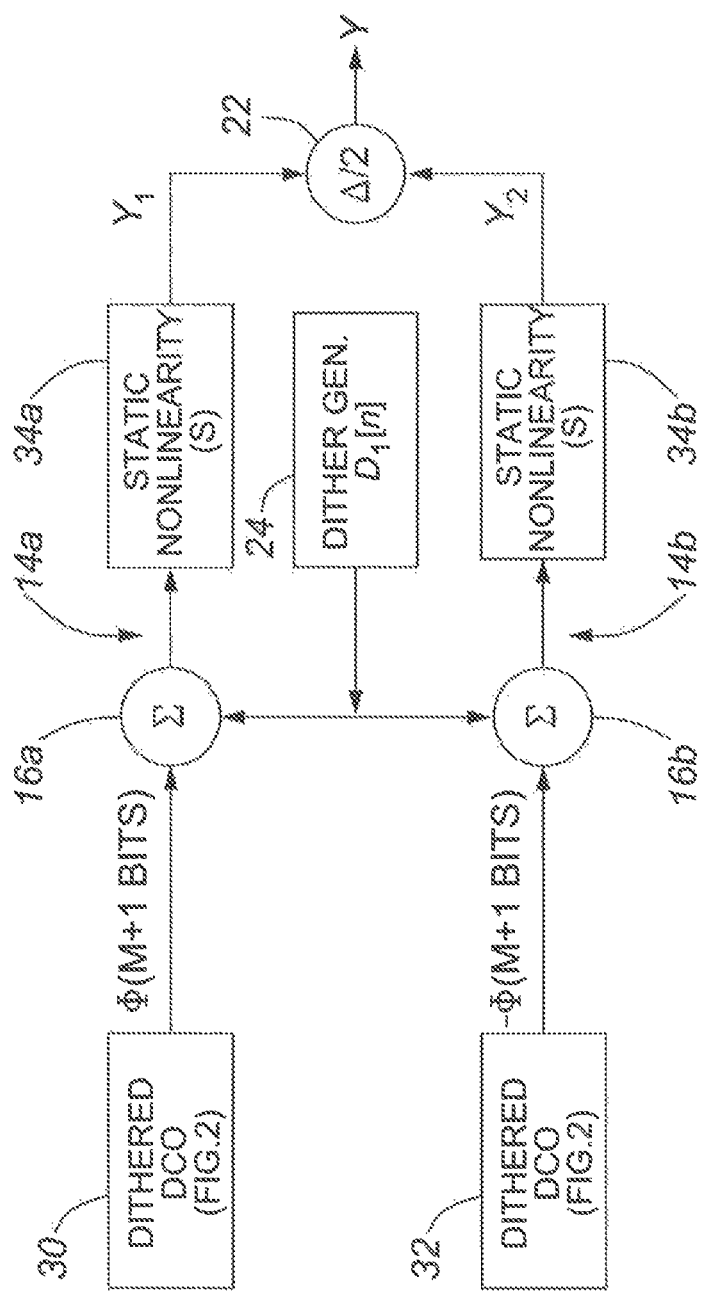
FIG. 7 is a block diagram of an apparatus for implementing differential dithering.

As shown in FIG. 7, embodiments of the invention can be used to reduce jitter due to any nonlinearity in the signal path. In FIG. 7, dithered DCOs 30, 32 produce M+1 bit outputs ϕ, −ϕ respectively. These are input to first inputs of adders 16a, 16b whose second inputs receive the dither signal from the dither generator 24 represented by a digital word D1[n].

The outputs of the adders 16a, 16b are fed to static nonlinear blocks 34a, 34b, whose outputs are fed to the combiner in the form of subtractor and divider-by-2 22. The nonlinear blocks 34a, 34b could be DACs, SDMs (Sigma Delta Modulators) or any other identical nonlinear blocks.

It will be understood that downstream DACs and/or other nonlinearities (e.g. sigma delta modulators) may be included in the signal path.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software running on a suitable processor.

The invention claimed is:

1. A digital frequency synthesizer with a provision for reducing the jitter introduced into a digital signal by a non-linear processing element, said digital frequency synthesizer including at least one digital controlled oscillator and being responsive to a frequency select word of N bits to generate an output, said digital frequency synthesizer comprising:
    a first signal path receiving an input word representing said digital signal and comprising a first non-linear processing element in the form of a first truncator reducing the number of bits to M, where M<N;
    a second signal path receiving a complementary version of said input word and comprising a second non-linear processing element in the form of a second truncator reducing the number of bits to M, where M<N;
    a dither signal generator for injecting a common mode dither signal into each signal path upstream of said first and second truncators;
    a combiner for combining outputs of said first and second truncators to produce a common output with said common mode dither signal removed; and
    a dither signal controller configured to control the operation of said dither signal generator to set the frequency of said dither signal based on said frequency select word.

2. A digital frequency synthesizer as claimed in claim 1, wherein said combiner comprises a subtractor subtracting an output of said second signal path from an output of said first signal path.

3. A digital frequency synthesizer as claimed in claim 2, wherein said combiner further comprises a divider for dividing an output of said subtractor by a predetermined number.

4. A digital frequency synthesizer as claimed in claim 1, further comprising an inverter upstream of said second signal path for generating the complement of said input word for input to said second signal path.

5. A digital frequency synthesizer as claimed in of claim 1, wherein said at least one digital controlled oscillator comprises a single digital controlled oscillator upstream of said first and second non-linear processing elements, and wherein said input word comprises an output phase word generated by said single said digital controlled oscillator.

6. A digital frequency synthesizer as claimed in claim 5, wherein said dither signal generator is configured to produce a dither signal that is a ramp or triangular signal in the phase domain.

7. A digital frequency synthesizer as claimed in claim 1, wherein said dither signal generator is configured to produce a dither signal that is a square wave signal in the frequency domain.

8. A digital frequency synthesizer as claimed in claim 1, wherein said first and second signal paths form part of a quantizer, said dither controller is configured to compute the values of $\Delta F$ and remainder R, where $$\Delta F = 2 \times \frac{BW}{Fclk} \text{ and}$$
$$R = \text{rem}(FSW, 2^{N-M})$$

and where FSW is said frequency select word, Fclk is a clock frequency of said digital synthesizer, and BW is the bandwidth of said quantizer; and
    said dither controller is configured to determine whether the conditions $$R > \frac{\Delta F}{2} \text{ and}$$
$$R < 2^{N-M} - \frac{\Delta F}{2}$$

apply, and if yes to command said dither signal generator to output no dither signal.

9. A digital frequency synthesizer as claimed in claim 8, wherein in response to a determination that said conditions $$R > \frac{\Delta F}{2} \text{ and}$$
$$R < 2^{N-M} - \frac{\Delta F}{2}$$

do not apply, said dither controller is configured to determine whether the condition $$R < \frac{\Delta F}{2}$$

applies, and if yes, to command said dither signal generator to output a dither signal having a frequency DF satisfying the condition:

$$2R+\Delta F<DF<2(2^{N-M}-R)$$

and if no, to command said digital signal generator to output a dither signal having the frequency DF satisfying the condition:

$$\Delta F+2(2^{N-M}-R)<DF<2R-\Delta F.$$

10. A digital frequency synthesizer, comprising:
    a digital or numerically controlled oscillator responsive to a frequency select word having a number of bits N to generate a phase output word of N bits at a frequency determined by said frequency select word;
    an inverter producing a complementary version of said phase output word;
    a first signal path receiving said phase output word and comprising a first truncator truncating said phase output word to produce a phase word having fewer bits than said phase output word;

a second signal path receiving the complementary version of said phase output word and comprising a second truncator truncating the complementary version of said phase output word to produce a phase word having fewer bits than said phase output word;

a dither signal generator injecting a common mode dither signal into each signal path upstream of said first and second truncators;

a combiner combining outputs of said first and second truncators to produce a common output phase word with said common mode dither signal removed; and a dither controller configured to control the operation of said dither signal generator to set the frequency of said dither signal based on said frequency select word.

11. A digital frequency synthesizer as claimed in claim 10, wherein said combiner comprises a subtractor subtracting an output of said second signal path from an output of said first signal path.

12. A digital frequency synthesizer as claimed in claim 11, wherein each said truncator reduces the number of bits in the phase output word to M bits, where M<N, and wherein the combiner further comprises a divider for dividing an output of said subtractor by 2 to produce a truncated phase output word having M+1 bits.

13. A digital frequency synthesizer as claimed in claim 10, wherein each of said first and second signal paths comprises an adder upstream of said respective first and truncators, each said adder having a first input receiving said phase output word or the complementary version thereof and a second input receiving an output of said dither signal generator.

14. A digital frequency synthesizer as claimed in claim 10, wherein said dither generator is configured to produce a dither signal that is a ramp or triangular signal in the phase domain.

15. A digital frequency synthesizer as claimed in claim 10, wherein the dither controller is configured to selectively turn on dithering on for peak jitter regions.

16. A digital frequency synthesizer as claimed in claim 10, wherein the dither controller is configured to set the frequency and amplitude of said dither signal based on said frequency select word.

17. A method as claimed in claim 10, further comprising setting the frequency and amplitude of the dither signal based on the frequency select word.

18. A method of reducing the jitter introduced into a software representation of a digital signal by a non-linear processing element in a digital frequency synthesizer including at least one digital controlled oscillator and being responsive to a frequency select word to generate an output, said method comprising:

applying an input word representing said digital signal to a first signal path comprising a first non-linear processing element;

applying a complementary version of said input word to a second signal path comprising a second non-linear processing element;

injecting a common mode dither signal into each signal path upstream of said non-linear processing elements;

combining outputs of said first and second non-linear processing elements to produce a common output with said common mode dither signal removed; and setting the frequency of said dither signal based on said frequency select word.

19. A method as claimed in claim 18, comprising combining said outputs by subtracting an output of said second signal path from an output of said first signal path, and dividing a result of said subtraction by a predetermined number.

20. A method as claimed in claim 18, wherein said first and second non-linear elements are truncators truncating a number of bits contained in said input word.

21. A method as claimed in claim 18, further comprising selectively applying the dither signal for high jitter regions.

* * * * *